United States Patent
Nagano et al.

(10) Patent No.: US 7,285,825 B2
(45) Date of Patent: Oct. 23, 2007

(54) ELEMENT FORMATION SUBSTRATE FOR FORMING SEMICONDUCTOR DEVICE

(75) Inventors: Hajime Nagano, Yokohama (JP); Shinichi Nitta, Yokohama (JP); Takashi Yamada, Ebina (JP); Tsutomu Sato, Yokohama (JP); Katsujiro Tanzawa, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/407,677

(22) Filed: Apr. 7, 2003

(65) Prior Publication Data

US 2004/0150044 A1   Aug. 5, 2004

(30) Foreign Application Priority Data

Jan. 21, 2003  (JP) .............................. 2003-012197

(51) Int. Cl.
*H01L 27/01* (2006.01)
*H01L 27/12* (2006.01)
*H01L 31/0392* (2006.01)

(52) U.S. Cl. ...................... 257/347; 257/507; 438/455

(58) Field of Classification Search ................ 438/455, 438/459, 977, 969; 257/347, 68–71, 296–313, 257/501, 506, 507, 510, 905–908
See application file for complete search history.

(56) References Cited

U.S. PATENT DOCUMENTS

| | | | | |
|---|---|---|---|---|
| 4,908,328 A * | 3/1990 | Hu et al. | ..................... | 438/269 |
| 5,194,395 A * | 3/1993 | Wada | ......................... | 438/143 |
| 5,578,518 A * | 11/1996 | Koike et al. | ................ | 438/424 |
| 5,894,152 A * | 4/1999 | Jaso et al. | ................... | 257/347 |
| 6,531,754 B1 * | 3/2003 | Nagano et al. | ............. | 257/510 |
| 6,624,047 B1 * | 9/2003 | Sakaguchi et al. | .......... | 438/458 |
| 6,635,543 B2 * | 10/2003 | Furukawa et al. | .......... | 438/311 |
| 6,635,915 B2 * | 10/2003 | Kokubun | ..................... | 257/301 |
| 6,844,242 B2 * | 1/2005 | Naruoka et al. | ............ | 438/455 |
| 6,855,976 B2 * | 2/2005 | Nagano et al. | ............. | 257/305 |
| 2003/0075260 A1 * | 4/2003 | Mitani | ........................ | 156/153 |

FOREIGN PATENT DOCUMENTS

JP        64-12543        1/1989

(Continued)

OTHER PUBLICATIONS

Peter Van Zant, Microchip Fabrication, 2000 McGraw-Hill, p. 391 and 392.*

(Continued)

*Primary Examiner*—Monica Lewis
(74) *Attorney, Agent, or Firm*—Finnegan, Henderson, Farabow, Garrett & Dunner, L.L.P.

(57) ABSTRACT

A support-side substrate having a thermal oxide film on the major surface is bonded to an active-layer-side substrate having a thermal oxide film on the major surface while making the major surfaces oppose each other. The active-layer-side substrate and part of the oxide film are selectively etched from a surface opposite to the major surface of the active-layer-side substrate to a halfway depth of the buried oxide film formed from the thermal oxide films at the bonding portion. A sidewall insulating film is formed on the etching side surface portion of the active-layer-side substrate. Then, the remaining buried oxide film except that immediately under the active-layer-side substrate is selectively etched. A single-crystal semiconductor layer is formed on the support-side substrate exposed by removing the buried oxide film.

7 Claims, 7 Drawing Sheets

FOREIGN PATENT DOCUMENTS

| | | |
|---|---|---|
| JP | 5-129173 | 5/1993 |
| JP | 8-17694 | 1/1996 |
| JP | 8-274286 | 10/1996 |
| JP | 9-64321 | 3/1997 |
| JP | 11-017001 | 1/1999 |
| JP | 11-17001 | 1/1999 |
| JP | 2002-110948 | 4/2002 |

OTHER PUBLICATIONS

S. Wolf, Silicon Processing, 1990, Lattice Press, p. 253.*

S. Wolf, Silicon Processing for the VLSI Era, Lattice Press, 1995, vol. III, pp. 634 and 635.*

Peter Van Zant, Microchip Fabrication, 2000, McGraw-Hill, Fourth Edition, p. 154.*

R. Hannon et al., "0.25 μm Merged Bulk DRAM and SOI Logic Using Patterned SOI", 2000 Symposium on VLSI Technology Digest of Technical Papers, pp. 66-67, (2000).

H.L. Ho et al., "A 0.13 μm High-Performance SOI Logic Technology With Embedded DRAM for System-on-a-Chip Application", IEDM, No. 01, pp. 503-506, (2001).

H. Nagano et al., "Manufacturing Method of Partial SOI Wafer, Semiconductor Device Using the Partial SOI Wafer and Manufacturing Method Thereof", Pending U.S. Appl. No. 10/083,131, filed Feb. 27, 2002.

T. Yamada et al., "Semiconductor Device Having One of Patterned SOI and SON Structure", Pending U.S. Appl. No. 10/096,655, filed Mar. 14, 2002.

H. Nagano et al., "Semiconductor Device Using Partial SOI Substrate and Manufacturing Method Thereof", Pending U.S. Appl. No. 10/078,344, Feb. 21, 2002.

H. Nagano et al., "Semiconductor Device Formed in Semiconductor Layer Arranged on Substrate With One of Insulating Film and Cavity Interposed Between the Substrate and the Semiconductor Layer", Pending U.S. Appl. No. 10/091,448, filed Mar. 7, 2002.

T. Yamada et al., "Semiconductor Chip Having Multiple Functional Blocks Integrated in a Single Chip and Method for Fabricating the Same", Pending U.S. Appl. No. 09/995,594, filed Nov. 29, 2001.

H. Nagano et al., "Semiconductor Device Substrate and Method of Manufacturing Semiconductor Device Substrate" Pending U.S. Appl. No. 10/237,206, filed Sep. 9, 2002.

Japanese Patent Office Final Notice of Rejection and English translation thereof in Japanese Patent Application No. 2003-012197, dated Nov. 17, 2006.

* cited by examiner

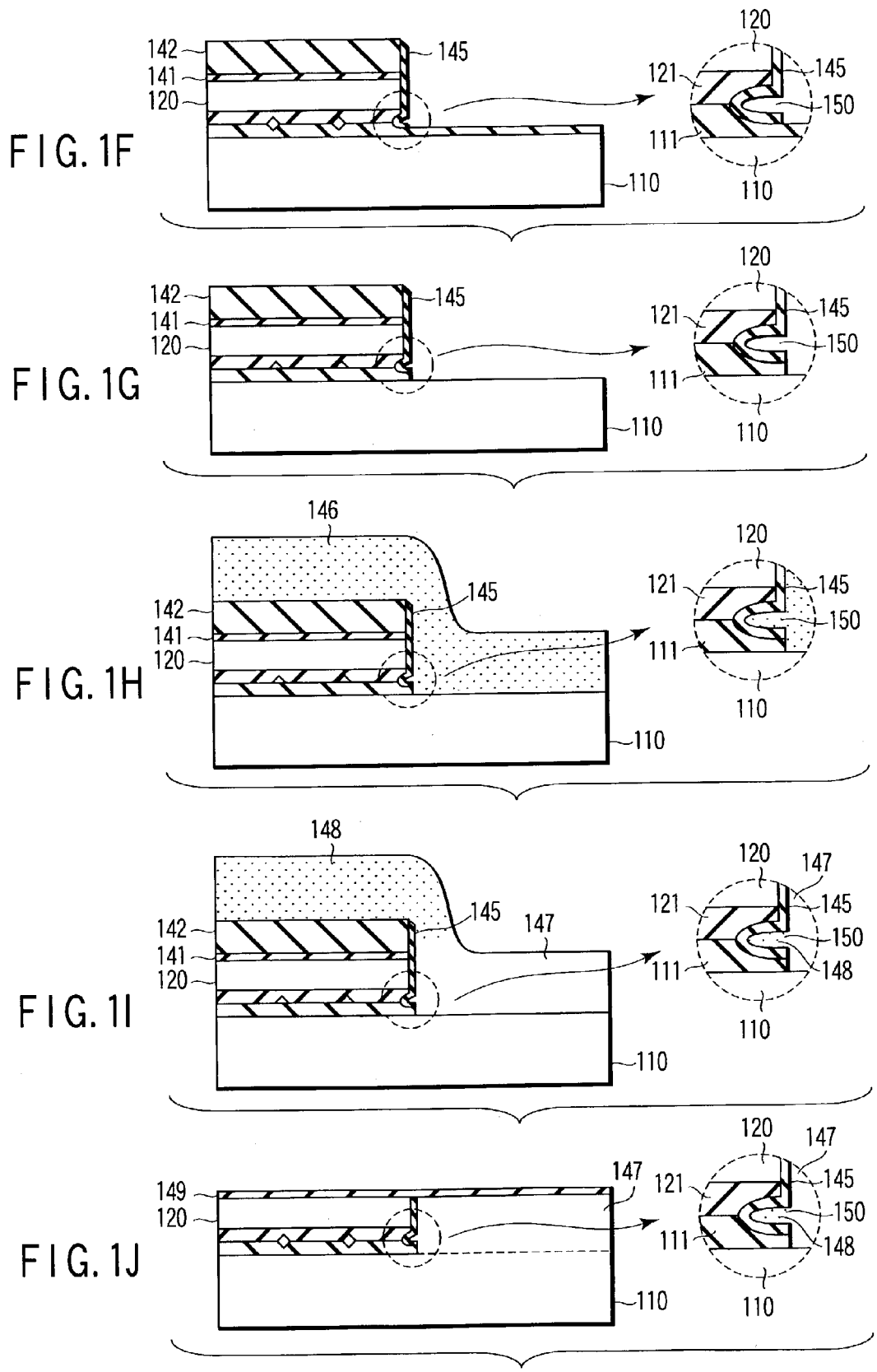

ELEMENT FORMATION SUBSTRATE FOR FORMING SEMICONDUCTOR DEVICE

CROSS-REFERENCE TO RELATED APPLICATIONS

This application is based upon and claims the benefit of priority from the prior Japanese Patent Application No. 2003-12197, filed on Jan. 21, 2003, the entire contents of which are incorporated herein by reference.

BACKGROUND OF THE INVENTION

1. Field of the Invention

The present invention relates to an element formation substrate having an SOI (Silicon On Insulator) region and a non-SOI region on the major surface side and a method of manufacturing the same. The present invention also relates to a semiconductor device using the element formation substrate.

2. Description of the Related Art

In recent years, an SOI substrate having an SOI layer formed on an Si substrate is used as an element formation substrate. In addition, various methods (so-called partial SOI technologies) of forming a non-SOI region other than an SOI region on part of an SOI substrate, forming a circuit section compatible with a substrate floating effect in the SOI region, and forming a circuit section incompatible with the substrate floating effect in the non-SOI region have been proposed.

For example, the SOI layer and buried insulating layer (BOX layer) on an SOI substrate are partially removed by etching. A silicon layer is epitaxially grown in the etching region and planarized by polishing, thereby forming a non-SOI region (e.g., Jpn. Pat. Appln. KOKAI Publication No. 8-17694). Alternatively, a bulk region is surrounded by an insulating spacer and conductive spacer to form a non-SOI region whereby the floating body effect is canceled and the SOI region is electrically disconnected from the non-SOI region (e.g., Jpn. Pat. Appln. KOKAI Publication No. 11-17001).

In either method, however, no detailed description is done in association with the structure of the SOI substrate used as a base and the structure of the BOX layer in the SOI region. For example, when an SOI substrate prepared by the bonding method is used as a base, its bonding interface is exposed as a support substrate surface by partially removing the SOI layer and BOX layer. Hence, undesired foreign substances that are inserted in the bonding process may sometimes remain on the support substrate surface. If foreign substances remain on the support substrate surface, it is difficult to form a high-quality non-SOI region. In addition, if the support substrate surface has metal contamination, it is difficult to control its influence on a semiconductor device when a non-SOI region is to be formed, or a semiconductor device is to be formed in the non-SOI region.

As described above, in the conventional element formation substrate prepared by forming a non-SOI region on an SOI substrate, the poor quality of the non-SOI region poses a problem.

BRIEF SUMMARY OF THE INVENTION

According to an aspect of the present invention, there is provided an element formation substrate comprising:

a first single-crystal semiconductor substrate having a major surface;

a second single-crystal semiconductor substrate bonded to part of the major surface of the first single-crystal semiconductor substrate via an oxide film;

a sidewall insulating film formed on a side surface of the second single-crystal semiconductor substrate; and a single-crystal semiconductor layer formed on a remaining portion of the major surface of the first single-crystal semiconductor substrate.

According to an aspect of the present invention, there is provided a method of manufacturing an element formation substrate, comprising:

bonding a first single-crystal semiconductor substrate having a first oxide film on a major surface to a second single-crystal semiconductor substrate having a second oxide film on a major surface via the first and second oxide films while making the major surfaces oppose each other;

selectively etching the second single-crystal semiconductor substrate and part of a buried oxide film formed from the first and second oxide films from a surface opposite to the major surface of the second single-crystal semiconductor substrate to a halfway depth of the buried oxide film;

forming a sidewall insulating film on an etching side surface of the second single-crystal semiconductor substrate;

selectively etching the remaining buried oxide film except that immediately under the second single-crystal semiconductor substrate; and forming a single-crystal semiconductor layer on the first single-crystal semiconductor substrate exposed by removing the buried oxide film.

According to an aspect of the present invention, there is provided a semiconductor device comprising:

a first single-crystal semiconductor substrate having a major surface;

a second single-crystal semiconductor substrate bonded to part of a major surface of the first single-crystal semiconductor substrate via an oxide film;

a sidewall insulating film formed on a side surface of the second single-crystal semiconductor substrate;

a single-crystal semiconductor layer formed on a remaining portion of the major surface of the first single-crystal semiconductor substrate;

a first device which is formed on a side of the second single-crystal semiconductor substrate and is compatible with a substrate floating effect; and a second device which is formed on a side of the single-crystal semiconductor layer and is incompatible with the substrate floating effect.

BRIEF DESCRIPTION OF THE SEVERAL VIEWS OF THE DRAWING

FIGS. 1A to 1J are sectional views showing the first half of steps in manufacturing an element formation substrate according to the first embodiment;

DETAILED DESCRIPTION OF THE INVENTION

The embodiments of the present invention will be described below with reference to the accompanying drawing.

First Embodiment

FIGS. 1A to 1J are sectional views showing steps in manufacturing an element formation substrate according to the first embodiment.

Figure 1A:
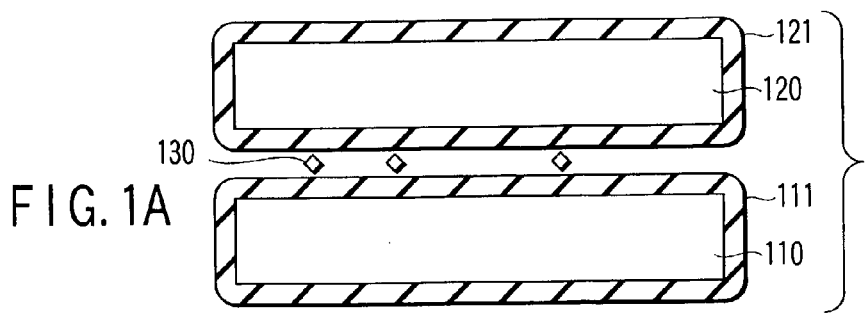

First, as shown in FIG. 1A, a silicon oxide film ($SiO_2$) 111 having a thickness of 0.1 μm or less is formed on the surface of a support-side substrate (first semiconductor substrate) 110 made of a single-crystal Si wafer by, e.g., thermal oxidation. In a similar way, a silicon oxide film ($SiO_2$) 121 having a thickness of 0.1 μm or less is formed on the surface of an active-layer-side substrate (second semiconductor substrate) 120 made of a single-crystal Si wafer by, e.g., thermal oxidation. Reference numeral 130 in FIG. 1A denotes a small foreign substance (dust) sticking to the bonding interface in the substrate bonding process.

Figure 1B:
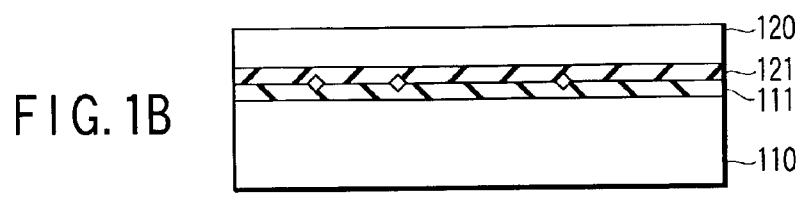

As shown in FIG. 1B, the major surfaces of the substrates 110 and 120 are brought into tight contact with each other, thereby bonding the silicon oxide films 111 and 121 at room temperature. At this time, no substances other than the silicon oxide that form the silicon oxide films 111 and 121 are inserted to the bonding interface. However, undesirable foreign substances 130 may be inserted to the bonding interface. After that, bonding annealing is performed at about 1,100° C. to firmly bond the substrates 110 and 120. Subsequently, the active-layer-side substrate 120 is thinned by polishing or etching. With this process, the active-layer-side substrate 120 becomes an SOI layer, and the silicon oxide films 111 and 121 become a BOX layer.

Figure 1C:
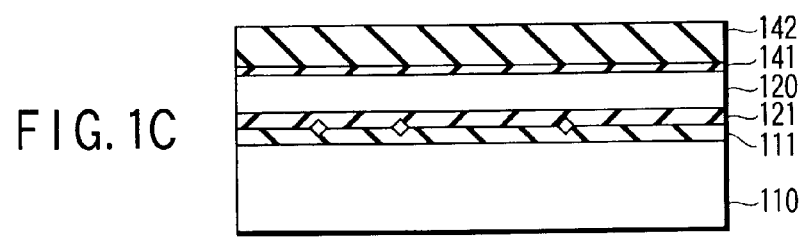

As shown in FIG. 1C, a silicon oxide film ($SiO_2$) 141 having a thickness of about 0.05 μm is formed on the active-layer-side substrate 120 by, e.g., thermal oxidation. A silicon nitride film (SiN) 142 having a thickness of about 0.2 μm is formed on the silicon oxide film 141.

Figure 1D:
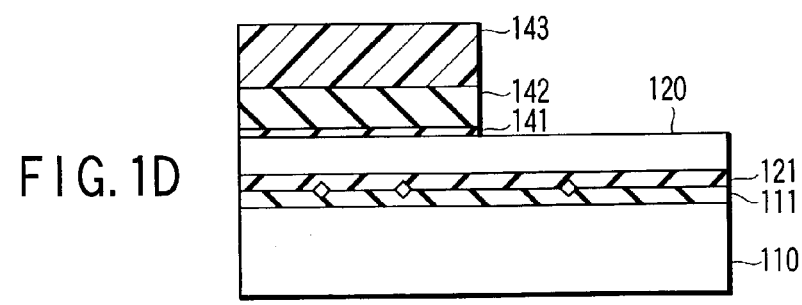

As shown in FIG. 1D, a resist mask 143 is formed on the silicon nitride film 142. The silicon nitride film 142 and silicon oxide film 141 are selectively etched using the resist mask 143. Then, the resist mask 143 is removed.

Figure 1E:
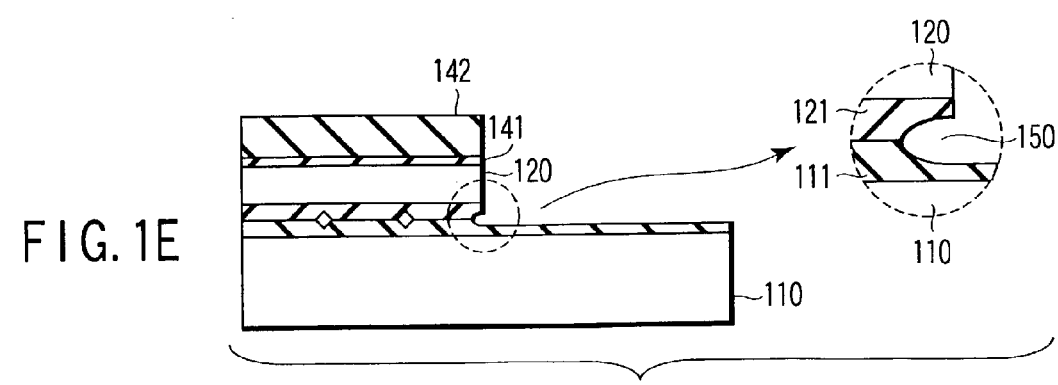

As shown in FIG. 1E, part of the active-layer-side substrate 120 and part of the silicon oxide films 121 and 111 are removed using the silicon nitride film 142 as a mask. More specifically, the active-layer-side substrate 120 is selectively etched by down flow (chemical-dry) etching. Subsequently, the silicon oxide films 121 and 111 are selectively etched to the position where the bonding interface is included, i.e., to the halfway position of the silicon oxide film 111. In this process, the etching rate of the bonding interface is higher than that of a normal oxide film. Hence, a recess 150 is formed in the BOX layer in the lateral direction.

Incidentally, when doing the part of active-layer-side-substrate 120 in the etching, it may use RIE (Reactive Ion Etching) instead of down flow etching. Moreover, when doing silicon oxide film 111 in the etching to the halfway position, it may use a solution etching instead of down flow etching.

As shown in FIG. 1F, a sidewall insulating film 145 having a thickness of about 0.1 μm is formed on the side surface portion of the active-layer-side substrate 120. More specifically, a very thin thermal oxide film (not shown) is formed on the entire surface (the upper surfaces of the silicon nitride film 142 and silicon oxide film 111 and the etching side surfaces of the silicon nitride film 142, silicon oxide film 141, active-layer-side substrate 120, and silicon oxide films 121 and 111). The silicon nitride film 145 is formed on the thermal oxide film. After that, the entire surface is etched by RIE (Reactive Ion Etching) to leave the silicon nitride film 145 only on the sidewall portion of the active-layer-side substrate 120. With this process, the inner surface of the recess 150 in the BOX layer formed in the preceding process is also covered with the silicon nitride film 145.

As shown in FIG. 1G, the silicon oxide film 111 except that immediately under the active-layer-side substrate 120 is removed. The buried oxide layer is removed using general hydrofluoric-acid-based solution etching. The surface of the support-side substrate 110, which is exposed in this process, is not the bonding interface. For this reason, even when the undesirable foreign substances 130 are inserted into the bonding interface in bonding the active-layer-side substrate 120 to the support-side substrate 110, the exposed surface of the support-side substrate 110 has no foreign substances 130 remaining there. That is, the surface is clean. Hence, a high-quality single-crystal Si layer can be formed on the exposed surface of the support-side substrate 110 in the subsequent processes. In addition, since the silicon oxide film 111 is removed by wet etching, the exposed surface of the support-side substrate 110 is not damaged by etching.

As shown in FIG. 1H, an amorphous Si layer 146 is formed on the entire surface. More specifically, to remove the natural oxide film on the surface of the support-side substrate 110, hydrogen cleaning is performed in a hydrogen atmosphere at 1,000° C. and 400 Pa for 3 min. Next, $SiH_4$ gas is supplied onto the sample having the structure shown in FIG. 1G to uniformly form the amorphous Si layer 146 having a thickness of about 0.3 μm at a temperature of 500° C.

As shown in FIG. 1I, to crystallize the amorphous Si layer 146, crystallization annealing is performed in a hydrogen atmosphere (hydrogen flow rate: 10 L/min) at 600° C. and 25 Pa. In this process, the amorphous Si layer 146 on the support-side substrate 110 changes to a single-crystal Si layer 147. The amorphous Si layer 146 on the silicon nitride film 142 changes to a polysilicon layer 148.

If the clean support-side substrate surface is not exposed in the process shown in FIG. 1G, crystallization does not normally progress, and no high-quality single-crystal Si layer can be formed on the support-side substrate surface. In this embodiment, since the clean support-side substrate surface is exposed, crystallization normally progresses. In addition, on the support-side substrate 110, since crystallization progresses on the basis of a single seed, a high-quality single-crystal Si layer can be formed.

The speed of signal crystal formation by the above crystallization annealing is about 0.6 nm/sec. When the process time is set to 500 sec, a 0.3-μm thick single-crystal layer can be formed. Hence, the silicon layer at the boundary between the portion on the support-side substrate 110 and that on the silicon nitride film 142 can be kept in the polycrystalline state. In addition, the silicon in the recess 150 of the silicon oxide films 111 and 121 is surrounded by the silicon nitride film 145. Hence, the silicon hardly changes to a crystal and remains in the polycrystalline state.

As shown in FIG. 1J, the polysilicon layer 148 on the silicon nitride film 142 is removed by polishing or etching using a solution mixture of hydrofluoric acid and nitric acid. The etching selectivity ratio of single-crystal Si and polysilicon to the solution mixture is sufficiently high. For this reason, only the polysilicon can be removed even by solution etching. Subsequently, after the silicon nitride film 142 and silicon oxide film 141 are removed, a new thermal oxide film (SiO$_2$) 149 is formed on the surface of the active-layer-side substrate Si layer 120 and the surface of the single-crystal Si layer 147.

With the above process, an element formation substrate having both an SOI region and a high-quality non-SOI region can be manufactured.

As described above, according to this embodiment, when an SOI substrate is to be formed by bonding substrates, the silicon oxide films 111 and 121 are formed on the surface of the two substrates 110 and 120. With this structure, even when foreign substances 130 are inserted at the time of bonding, the foreign substances can kept inserted between the silicon oxide films 111 and 121. No foreign substances stick to the surface of the support-side substrate 110. Hence, the surface of the support-side substrate 110 can be kept clean. In the process shown in FIG. 1G, the clean surface of the support-side substrate 110 can be exposed. For this reason, subsequent deposition and single-crystal formation of amorphous Si can be satisfactorily executed, so a high-quality non-SOI region can be formed.

That is, an element formation substrate which makes it possible to form high-quality non-SOI region on an SOI substrate and is suitable for integrating a logic circuit, DRAM, and the like on a single semiconductor chip can be implemented. When a logic element, DRAM, and the like are integrated on the same chip using this substrate, a high-performance semiconductor device can be implemented.

When the substrate 120 and silicon oxide films 121 and 111 are selectively etched using solution etching or down flow etching, the recess 150 can be formed in the side surfaces of the silicon oxide films 121 and 111. The recess 150 functions as a gettering site. For this reason, even when the non-SOI region has metal contamination, polysilicon in the recess 150 can getter the metal contamination. Hence, any adverse affect on the semiconductor device formed in the non-SOI region can be suppressed.

The thickness of each of the silicon oxide films 111 and 121 formed on the surfaces of the substrates 110 and 120 before bonding the substrates is preferably 0.1 μm or less. The total thickness is preferably 0.2 μm or less. If the silicon oxide films 111 and 121 become thicker, heat generated when the device formed on the SOI layer operates cannot be radiated. That is, it becomes difficult to suppress self-heating. Furthermore, since stress acts on the SOI layer, the carrier mobility degrades.

Second Embodiment

FIGS. 2A to 2E are sectional views showing steps in manufacturing an element formation substrate according to the second embodiment. Reference numerals 210 to 249 in FIGS. 2A to 2E correspond to reference numerals 110 to 149 in FIGS. 1A to 1J.

The second embodiment is different from the above-described first embodiment in that the buried oxide layer is etched to a position where the bonding interface is not included.

Figure 2A:
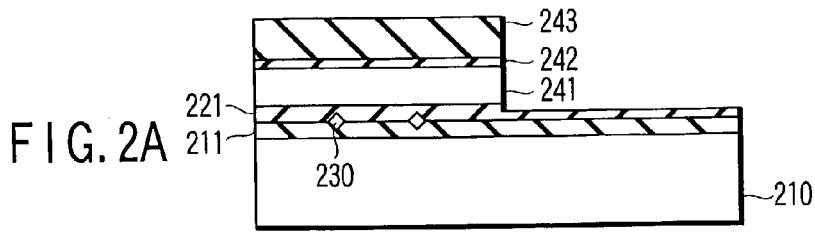
FIGS. 2A to 2E are sectional views showing steps in manufacturing an element formation substrate according to the second embodiment.

After the process shown in FIG. 1D, part of an active-layer-side substrate 220 and part of a silicon oxide film 221 are removed using a silicon nitride film 242 as a mask, as shown in FIG. 2A. More specifically, the active-layer-side substrate 220 is selectively etched by down flow (chemical-dry) etching. Subsequently, the silicon oxide film 221 is etched to a position where the bonding interface is not included, i.e., to a halfway position of the silicon oxide film 221.

Figure 2B:
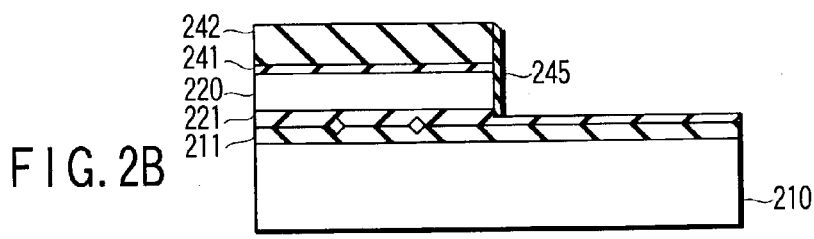

As shown in FIG. 2B, a sidewall protective film 245 is formed on the side surface portion of the active-layer-side substrate 220. The sidewall insulating film 245 is a silicon nitride film. The method of forming it is the same as in the first embodiment.

Figure 2C:
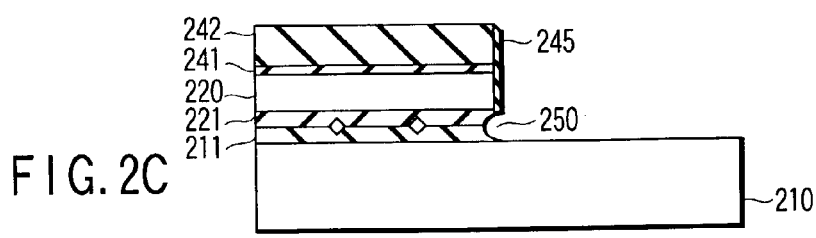

As shown in FIG. 2C, the silicon oxide films 221 and 211 except those immediately under the active-layer-side substrate 220 are removed. The buried oxide layers are removed using general hydrofluoric-acid-based solution etching. In this process, the etching rate of the bonding interface is higher than that of a normal oxide film. Hence, a recess 250 is formed in the BOX layer in the lateral direction.

The surface of a support-side substrate 210, which is exposed in this process, is not the bonding interface. For this reason, even when undesirable foreign substances 230 are inserted into the bonding interface in bonding the active-layer-side substrate 220 to the support-side substrate 210, the exposed surface of the support-side substrate 110 has no foreign substances 230 remaining. That is, the surface is clean. Hence, a high-quality single-crystal Si layer can be formed on the exposed surface of the support-side substrate 110 in the subsequent processes. In addition, since the silicon oxide films 212 and 211 are removed by wet etching, the exposed surface of the support-side substrate 210 is not damaged by etching.

Figure 2D:
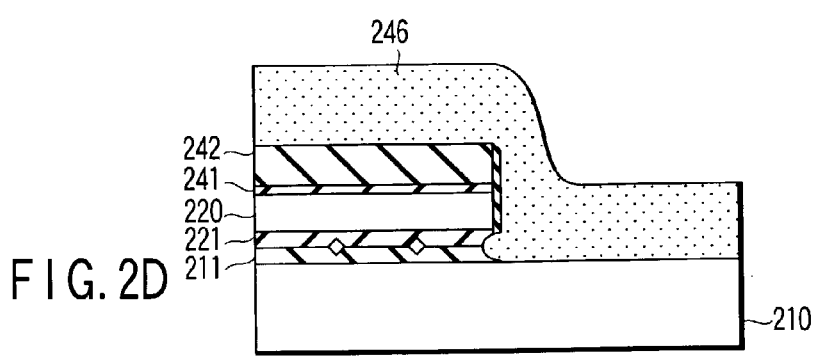
Figure 2E:
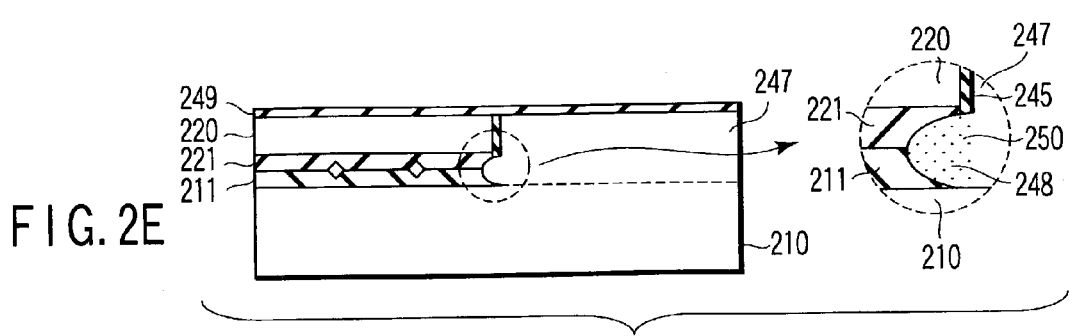

As shown in FIG. 2D, an amorphous Si layer 246 is formed on the entire surface. The method of forming the amorphous Si layer 246 is the same as in the first embodiment.

Subsequently, as in the first embodiment, crystallization annealing is performed to crystallize the amorphous Si layer 246. Next, silicon on a silicon nitride film 245 is removed. After the silicon nitride film 245 and silicon oxide film 241 are removed, a new thermal oxide film 249 is formed to obtain the structure shown in FIG. 2E.

With the above process, an element formation substrate having both an SOI region and a high-quality non-SOI region can be manufactured. The final structure is the same as in the first embodiment except that the silicon nitride film 245 is not present in the recess 250 on the side surfaces of the silicon oxide films 211 and 212. For this reason, the same effect as in the first embodiment can be obtained.

Third Embodiment

Figure 3A:
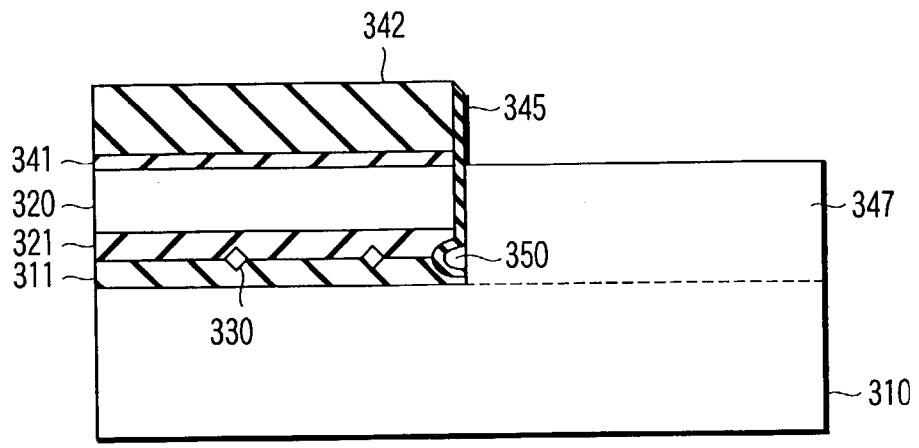
FIGS. 3A and 3B are sectional views showing steps in manufacturing an element formation substrate according to the third embodiment.
Figure 3B:
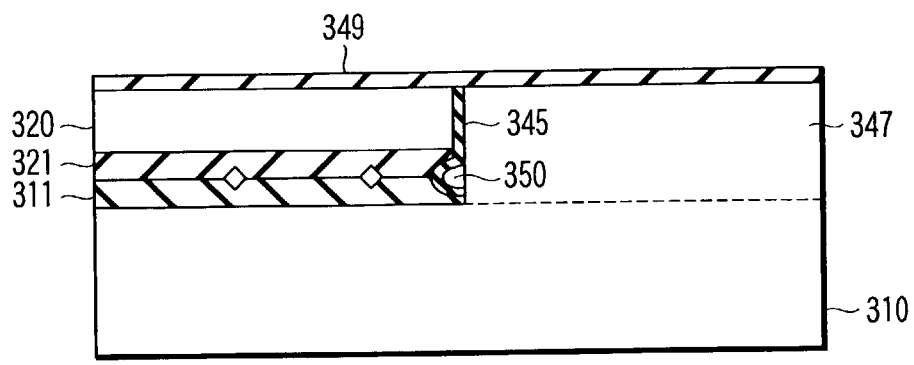

FIGS. 3A and 3B are sectional views showing steps in manufacturing an element formation substrate according to the third embodiment. Reference numerals 310 to 349 in FIGS. 3A and 3B correspond to reference numerals 110 to 149 in FIGS. 1A to 1J.

The third embodiment is different from the above-described first embodiment in that Si layers in the process shown in FIGS. 1H and 1I are formed by the selective epitaxial method.

After the process shown in FIG. 1G, a single-crystal Si layer 347 is selectively epitaxially grown on the exposed surface of a support-side substrate 310, as shown in FIG. 3A. More specifically, the single-crystal Si layer 347 is epitaxially grown only on the surface of the support-side substrate 310 by selective epitaxial growth using dichlorosilane and hydrochloric acid without growing the Si layer on a silicon nitride film 342. In this case, the portion where the polysilicon layer is buried in the first and second embodiments forms a cavity 350. The cavity portion 350 also functions as a gettering site. In addition, since no polysilicon layer is formed on the silicon nitride film 342, the process of removing the polysilicon layer can be omitted.

As shown in FIG. 3B, after the silicon nitride films 342 and 345 and silicon oxide film 341 on an active-layer-side substrate 320 are removed, a new thermal oxide film 349 is formed. With the above process, an element formation substrate having both an SOI region and a high-quality non-SOI region can be manufactured.

Fourth Embodiment

FIGS. 4A to 4E are sectional views showing steps in manufacturing an element formation substrate according to the fourth embodiment. Reference numerals 410 to 449 in FIGS. 4A to 4E correspond to reference numerals 110 to 149 in FIGS. 1A to 1J.

The fourth embodiment is different from the above-described first embodiment in that bonding annealing for substrate bonding is performed at a higher temperature.

In the process shown in FIG. 1B, bonding annealing is performed not at 1,100° C. but at a higher temperature, 1,200° C. This increases the bonding strength between silicon oxide films 411 and 421 and suppresses any increase in etching rate on the bonding interface.

After that, as in the first embodiment, a thermal oxide film 441, silicon nitride film 442, and resist mask 443 are formed. The silicon nitride film 442 and thermal oxide film 441 are selectively removed. Then, the resist mask 443 is removed.

Figure 4A:
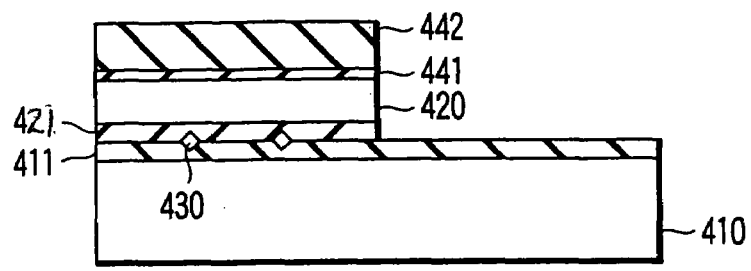
FIGS. 4A to 4E are sectional views showing steps in manufacturing an element formation substrate according to the fourth embodiment.

Next, as shown in FIG. 4A, part of an active-layer-side substrate 420 and part of the silicon oxide films 421 and 411 are removed using the silicon nitride film 442 as a mark. More specifically, the active-layer-side substrate 420 is selectively etched by down flow (chemical-dry) etching. Subsequently, the silicon oxide films 421 and 411 are selectively etched to a position where the bonding interface is included, i.e., to a halfway position of the silicon oxide film 411. In this process, since the bonding annealing temperature at the bonding interface between the oxide films is higher than that in the first embodiment by about 100° C., no recess in the lateral direction is formed in the BOX layer.

Figure 4B:
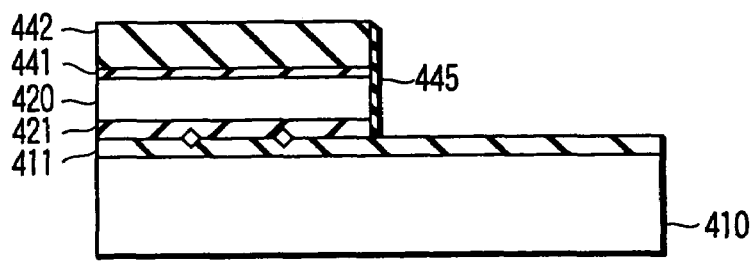
Figure 4C:
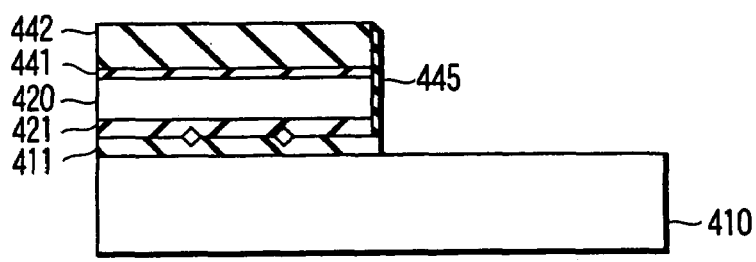

Subsequently, as in the first embodiment, a sidewall insulating film 445 made of silicon nitride is formed on the side surface portion of the active-layer-side substrate 420, as shown in FIG. 4B. Then, as shown in FIG. 4C, the remaining portion of the silicon oxide film 411 is removed.

Figure 4D:
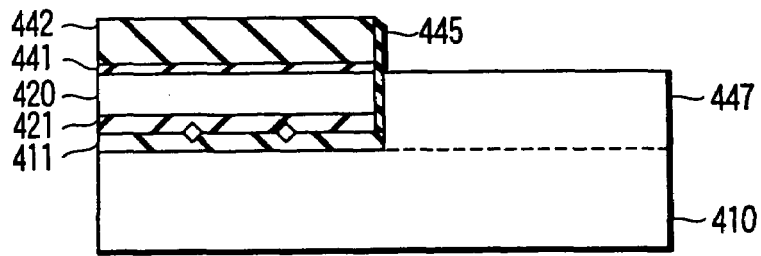

As shown in FIG. 4D, a single-crystal Si layer 447 is formed only on the surface of a support-side substrate 410. The single-crystal Si layer 447 can be formed in accordance with the same procedure as in the first embodiment. More specifically, after an amorphous Si layer is formed on the entire surface, the amorphous Si layer is crystallized. Then, the silicon on the silicon nitride film 442 is removed by polishing or etching using a solution mixture of hydrofluoric acid and nitric acid.

Figure 4E:
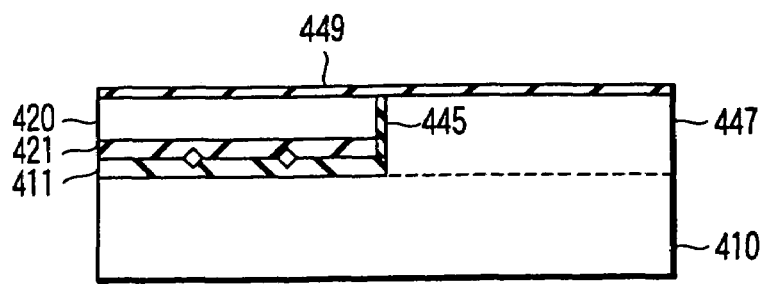

As shown in FIG. 4E, after the silicon nitride films 442 and 445 and silicon oxide film 441 on the active-layer-side substrate 420 are removed, a new thermal oxide film 149 is formed. With the above process, an element formation substrate having both an SOI region and a high-quality non-SOI region can be manufactured.

Fifth Embodiment

Figure 5:
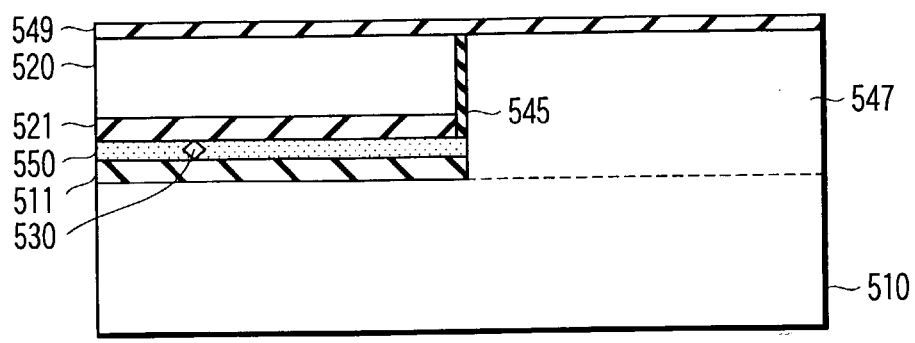
FIG. 5 is a sectional view showing the structure of an element formation substrate according to the fifth embodiment.

FIG. 5 is a sectional view showing the structure of an element formation substrate according to the fifth embodiment. Reference numerals 510 to 549 in FIG. 5 correspond to reference numerals 110 to 149 in FIGS. 1A to 1J.

The fifth embodiment is different from the above-described first embodiment in that a polysilicon layer 550 is inserted between silicon oxide films 511 and 521 in substrate bonding.

In the process shown in FIG. 1A of the first embodiment, the silicon oxide films 511 and 521 each having a thickness of 0.1 µm or less are formed on the substrate surfaces of both of an active-layer-side substrate 520 and support-side substrate 510 by, e.g., thermal oxidation, as shown in FIG. 5. The polysilicon layer 550 is formed on at least one of the silicon oxide films.

After that, the major surfaces of the two substrates 510 and 520 are brought into tight contact with each other, thereby bonding one of the silicon oxide films 511 and 521 to the polysilicon layer 550 at room temperature. Then, bonding annealing is performed at about 1,100° C. to increase the bonding strength. Subsequent processes are the same as in the first embodiment.

Even with the above process, the obtained structure is almost the same as in the first embodiment except that the polysilicon layer 550 is present between the silicon oxide films 511 and 521. Hence, the same effect as in the first embodiment can be obtained.

Figure 6:
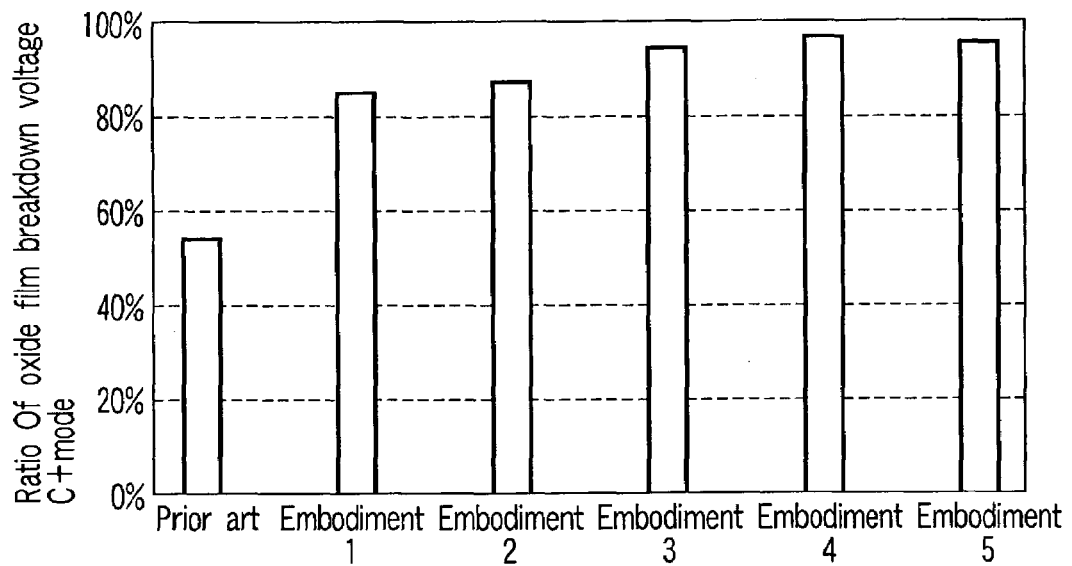
FIG. 6 is a graph showing the breakdown voltage characteristics of the oxide films in the embodiments.

The significance of the element formation substrates of the above embodiments will be described next. FIG. 6 shows results obtained by forming a TEG (Test Element Group) for oxide film breakdown voltage elevation in each of the non-SOI regions of partial SOI wafers prepared in the first to fifth embodiments and evaluating their breakdown voltages. "Breakdown voltage C+mode" is equivalent to "intrinsic breakdown voltage", i.e., the breakdown voltage based on the quality of an oxide film itself. That is, it means that an oxide film itself breaks due to not an extrinsic degradation but an intrinsic reason.

Figure 7:
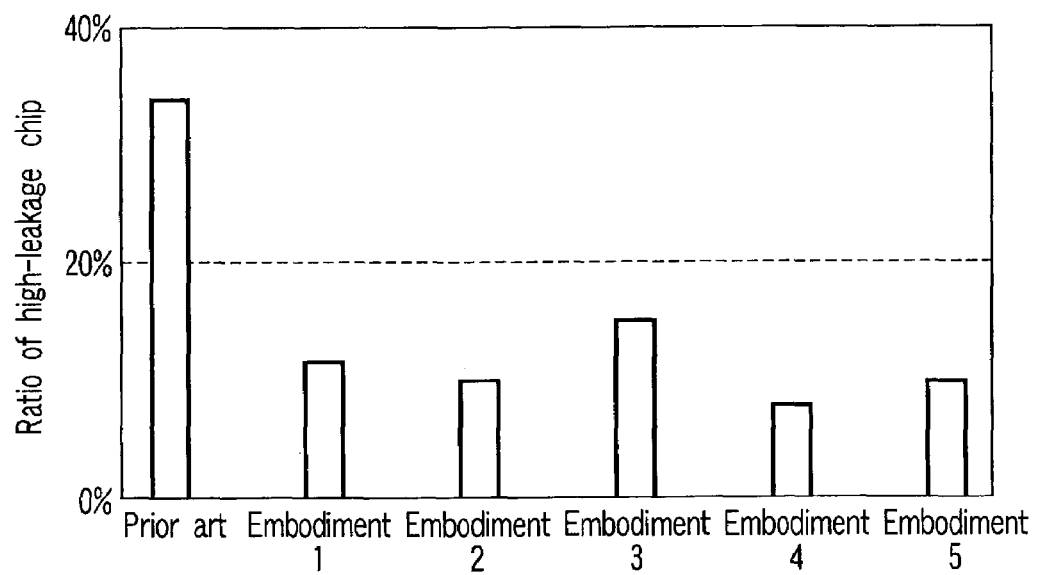
FIG. 7 is a graph showing junction leakage characteristics in the embodiments.

FIG. 7 shows results obtained by forming about 9,000 pn junctions in an 8-inch wafer surface, applying a reverse bias to the pn junctions, and evaluating their junction leakage characteristics. "High leakage" indicates that a leakage current larger than a standard leakage current by two or more orders of magnitudes flows at a certain bias.

As compared to the prior art, all the partial SOI wafers according to the embodiments have higher breakdown voltages than a conventional partial SOI wafer. This is probably because the non-SOI regions of the partial SOI wafers of the embodiments have few crystal defects and few metal impurities that may generate a leakage current. Hence, when the partial SOI wafers of the embodiments are used, semiconductor devices having a higher quality than the prior art can be manufactured.

Figure 8:
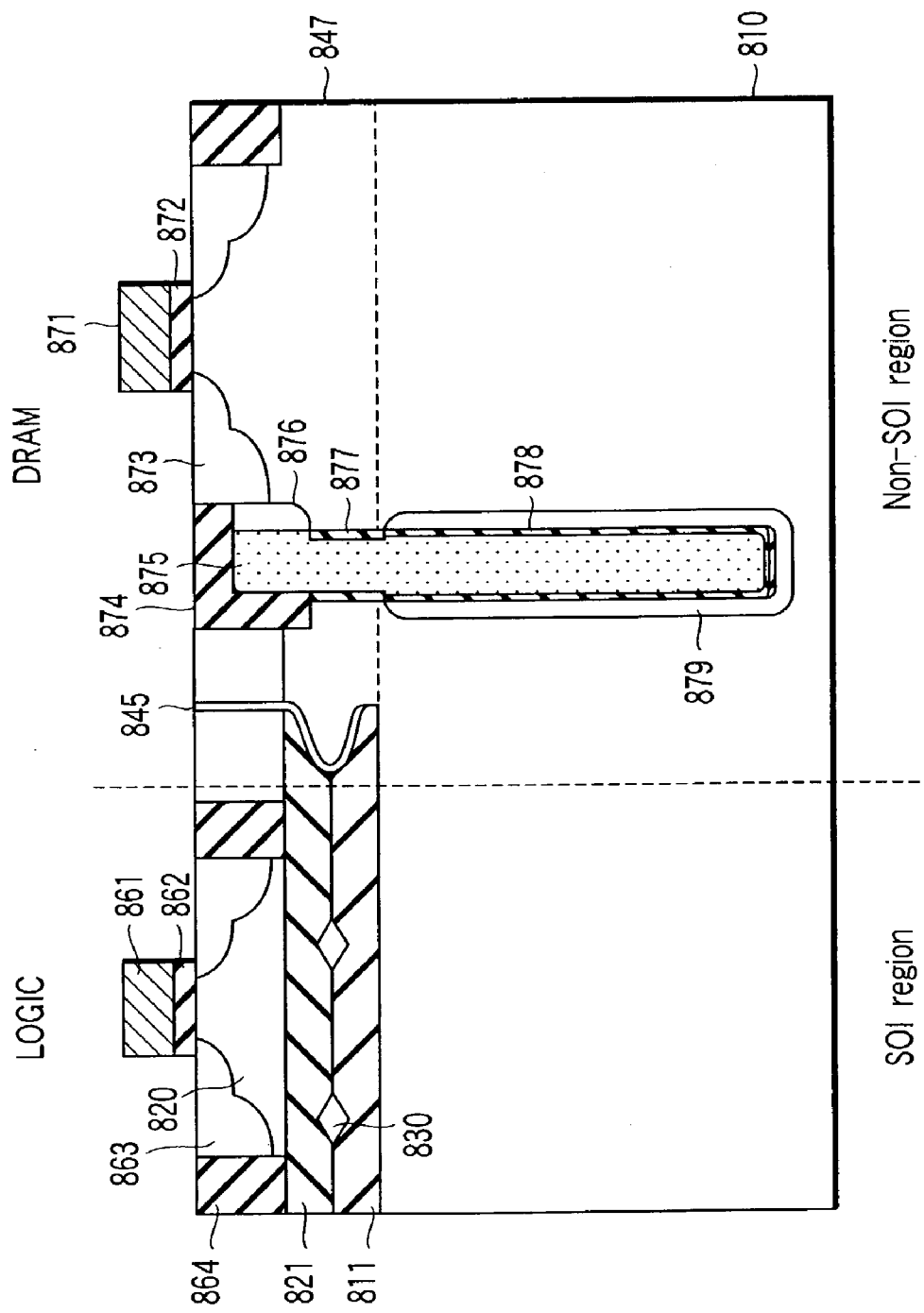
FIG. 8 is a sectional view showing the structure of a semiconductor device manufactured using the element formation substrate according to the first embodiment.

FIG. 8 shows an example of a semiconductor device formed on a partial SOI wafer manufactured in the first embodiment. A logic element is formed in an SOI region made of an active-layer-side substrate 820 bonded to a support-side substrate 810 via oxide films 811 and 821. A DRAM is formed in a non-SOI region where a single-crystal Si layer 847 is formed on the support-side substrate 810.

Referring to FIG. 8, reference numeral 830 denotes a foreign substance; 845, a silicon nitride film; 861 and 871, gate electrodes; 862 and 872, gate oxide films; 863 and 873, source/drain diffusion layers; 864 and 874, element isolation insulating films; 875, a capacitor electrode serving as a storage node; 876, a diffusion layer which connects the source/drain to the capacitor electrode; 877, a nitride film which insulates and isolates the capacitor electrode from the substrate; 878, a capacitor insulating film; and 879, a diffusion layer serving as a common electrode of the capacitor.

When a logic element is formed in the SOI region, the performance of the logic element can be increased. When a DRAM is formed in the non-SOI region, a leakage current due to circuit operation or a variation in characteristic such as a threshold value can be suppressed. That is, both the logic element and the DRAM can be formed in optimum regions, and a high-performance LSI with the logic element and DRAM integrated on a single semiconductor chip can be implemented.

The present invention is not limited to the above-described embodiments. The etching depth to partially remove the active-layer-side substrate is not limited to a halfway depth of the oxide film on the support-side substrate surface or a halfway depth of the oxide film on the active-layer-side substrate. Etching may reach the interface between the oxide films. Each of the thickness of the oxide film formed on the surface of the support-side substrate and the thickness of the oxide film formed on the surface of the active-layer-side substrate can appropriately be set within the range of 0.1 µm or less such that the total thickness becomes 0.2 µm or less. In the embodiment, a single-crystal Si layer is formed on the support-side substrate by forming an amorphous Si layer and converting it to a single crystal. Instead, a polysilicon layer may be formed and converted into a single crystal.

In the embodiments, silicon substrates are used as the first and second single-crystal semiconductor substrates. However, any other semiconductor materials except silicon may be used as the substrate material. In addition, various changes and modifications can be made within the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor substrate comprising:
   a first single-crystal semiconductor substrate including a major surface having a first region and a second region adjacent to the first region;
   an oxide film formed on the major surface in the first region, the oxide film including a first side surface having a recess;
   a second single-crystal semiconductor substrate formed on the oxide film, the second single-crystal semiconductor substrate including a second side surface being continuous with the first side surface;
   an insulating film formed on the second side surface;
   a single-crystal semiconductor layer formed on the major surface in the second region without the oxide film, the single-crystal semiconductor layer including a third side surface contacting the insulating film and facing the first side surface; and
   a non single-crystal silicon layer including amorphous silicon and polysilicon and disposed in the recess of the first side surface.

2. A semiconductor substrate according to claim 1, wherein the insulating film is essentially made of silicon nitride.

3. A semiconductor device comprising:
   a first single-crystal semiconductor substrate having a major surface;
   a first oxide film on the first single-crystal semiconductor substrate;
   a second single-crystal semiconductor substrate having formed thereon a second oxide film, wherein the second single-crystal semiconductor is bonded to part of the major surface of the first single-crystal semiconductor substrate via the first and second oxide films, the first and second oxide films being in contact with each other, and the second oxide film being provided between the first oxide film and the second single-crystal semiconductor substrate;
   a sidewall insulating film formed on a side surface of the second single-crystal semiconductor substrate;
   a single-crystal semiconductor layer formed on a remaining portion of the major surface of the first single-crystal semiconductor substrate;
   a first device which is formed on a side of the second single-crystal semiconductor substrate and is compatible with a substrate floating effect; and
   a second device which is formed on a side of the single-crystal semiconductor layer and is incompatible with the substrate floating effect.

4. A substrate according to claim 3, wherein the first device is a logic circuit element, and the second device is a DRAM element.

5. A semiconductor device comprising:
   a first single-crystal semiconductor substrate having a major surface;
   a first oxide film on the first single-crystal semiconductor substrate;
   a second single-crystal semiconductor substrate having formed thereon a second oxide film, wherein the second single-crystal semiconductor substrate is bonded to part of the major surface of the first single-crystal semiconductor substrate via the first and second oxide films, the first and second oxide films being in contact with each other, and the second oxide film being provided between the first oxide film and the second single-crystal semiconductor substrate;
   a sidewall insulating film formed on a side surface of the second single-crystal semiconductor substrate;
   a single-crystal semiconductor layer formed only on a remaining portion of the major surface of the first single-crystal semiconductor substrate;
   a first device which is formed on a side of the second single-crystal semiconductor substrate and is compatible with a substrate floating effect; and
   a second device which is formed on a side of the single-crystal semiconductor layer and is incompatible with the substrate floating effect.

6. A semiconductor substrate according to claim 1, wherein the insulating film is formed on the first side surface, and the non single-crystal silicon layer is formed between the insulating film formed on the portion of the first side surface in the recess and the third side surface of the single-crystal semiconductor layer.

7. A semiconductor substrate according to claim 1, wherein the, first side surface includes a non-recess portion facing the third side surface via a portion of the insulating film without the non single-crystal silicon layer.

* * * * *

UNITED STATES PATENT AND TRADEMARK OFFICE
CERTIFICATE OF CORRECTION

PATENT NO. : 7,285,825 B2  Page 1 of 1
APPLICATION NO. : 10/407677
DATED : October 23, 2007
INVENTOR(S) : Nagano et al.

It is certified that error appears in the above-identified patent and that said Letters Patent is hereby corrected as shown below:

Claim 7, column 10, line 53, change "the, first" to --the first--.

Signed and Sealed this

Eleventh Day of March, 2008

JON W. DUDAS
*Director of the United States Patent and Trademark Office*